(12) United States Patent
Tanaka et al.

(10) Patent No.: US 6,456,523 B1
(45) Date of Patent: Sep. 24, 2002

(54) FERROMAGNETIC DOUBLE QUANTUM WELL TUNNEL MAGNETO-RESISTANCE DEVICE

(75) Inventors: Masaaki Tanaka, Saitama-ken; Toshiaki Hayashi, Tokyo, both of (JP)

(73) Assignee: Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 09/762,804

(22) PCT Filed: Mar. 10, 2000

(86) PCT No.: PCT/JP00/01476

§ 371 (c)(1),
(2), (4) Date: Feb. 13, 2001

(87) PCT Pub. No.: WO01/04970

PCT Pub. Date: Jan. 18, 2001

(30) Foreign Application Priority Data

Jul. 9, 1999 (JP) ............................................ 11-196724
Jan. 31, 2000 (JP) ...................................... 2000-022691

(51) Int. Cl.$^7$ ................................................ G11C 11/00
(52) U.S. Cl. ........................ 365/158; 365/171; 365/173
(58) Field of Search ................................ 365/158, 171, 365/173; 257/421, 30, 25; 360/112, 113

(56) References Cited

U.S. PATENT DOCUMENTS 4,982,248 A * 1/1991 Laibowitz et al. ............ 257/77
5,463,516 A    10/1995 Valet et al. .................. 360/113
5,657,189 A *  8/1997 Sandhu ........................ 360/112
5,747,859 A *  5/1998 Mizushima et al. ........ 257/421
5,877,511 A *  3/1999 Tanamoto et al. ............ 257/30

* cited by examiner

*Primary Examiner*—Hoai Ho
*Assistant Examiner*—Gene N. Auduong
(74) *Attorney, Agent, or Firm*—Armstrong, Westerman & Hattori, LLP

(57) ABSTRACT

A ferromagnetic double quantum well tunneling magnetoresistance device is disclosed that utilizes a two-dimensional electron (positive hole) system to obtain an infinitely great magnetoresistance ratio. Also disclosed are a sensitive magnetic sensor and a nonvolatile storage device derived from that device. In structural terms of the device, a first and a second quantum well layer of ferromagnetic material (4, 8) in each of which the quantum confinement for carriers is established in a two-dimensional electron (positive hole) state are each sandwiched between a pair of barrier layers of nonmagnetic material (2, 6, 10) through which the carriers can tunnel. The first and second quantum well layers (4, 8) have a difference in coercive force so that when an external magnetic field is applied thereto only one of them may be reversed in the direction of magnetization. As a result, if magnetizations of the two quantum wells are parallel to each other, tunneling is allowed to occur, and if they are antiparallel to each other, tunneling is inhibited. A infinitely great tunneling magnetoresistance ratio is thereby obtained.

13 Claims, 5 Drawing Sheets

FERROMAGNETIC DOUBLE QUANTUM WELL TUNNEL MAGNETO-RESISTANCE DEVICE

TECHNICAL FIELD

This invention relates to a ferromagnetic double quantum well tunneling magnetoresistance device for use in devices such as magnetic sensors, magnetic sensor heads, magnetoresistance effect devices and nonvolatile storages and so forth, which device utilizes a tunneling magnetoresistance effect that is brought about across two quantum wells by controlling directions of magnetizations caused in the two quantum wells.

BACKGROUND ART

A conventional tunneling magnetoresistance device makes use of rather a simple, three layer structure such as of a ferromagnetic metallic layer, an insulator layer and a ferromagnetic metallic layer. In such a device the ferromagnetic metallic layers in many cases are relatively thick with a thickness as large as several tens nanometers. What is utilized in the device is not a two-dimensional electron system by quantum confinement but a tunnel phenomenon in a three-dimensional electron system.

For this reason the need arises to use a ferromagnetic metal whose spin polarization is large enough to gain a large tunneling magnetoresistance, but spin polarization of ordinary ferromagnetic metals are not so much large and they are limited to at most 40 to 45%. While by using a ferromagnetic material called "half metal" whose spin polarization is 100% it is expected that ideally an infinitely great value of tunneling magnetoresistance ratio, i.e., a change in electric resistance by application of a magnetic field divided by electric resistance when magnetization is parallel, is obtainable, this option has left problems to be resolved in respect of material engineering and fabrication techniques.

On the other hand, ordinary devices of the three-layer structure of a ferromagnetic metallic layer, an insulator layer and a ferromagnetic metallic layer has presented the problem that the tunneling magnetoresistance decreases in magnitude with an increase in the bias voltage, which must be resolved.

Accordingly, with these problems borne in mind, it is a first object of the present invention to provide a ferromagnetic double quantum well tunneling magnetoresistance device that derives an infinitely great value of tunneling magnetoresistance ratio with a desired bias voltage, by utilizing a two-dimensional electron (or positive hole) system.

A second object of this invention is to provide a sensitive magnetic sensor that is capable of detecting magnetism with an enhanced sensitivity.

A third object of this invention is to provide a nonvolatile storage that is both readable and writable.

DISCLOSURE OF THE INVENTION

In order to achieve the first object mentioned above, there is provided in accordance with the present invention a construction comprising a first and a second quantum well layer of ferromagnetic material each of which is sandwiched between barrier layers of non-magnetic material, in which a change in direction of magnetizations in the said first and second quantum layers causes carriers to tunnel between them, thereby producing a change in magnetoresistance across them.

Further, in addition to the construction mentioned above, the said first and second quantum well layers in the ferromagnetic double quantum well tunneling magnetoresistance device according to the present invention have a difference in coercive force.

Also, the said first and second quantum well layers in the ferromagnetic double quantum well tunneling magnetoresistance device according to the present invention have a thickness less than a de Broglie wavelength of the carriers.

Also, the said first and second quantum well layers in the ferromagnetic double quantum well tunneling magnetoresistance device according to the present invention has a two-dimensional electron or positive hole condition established therein for subjecting the carriers to a quantum confinement.

Further, each of the said first and second quantum well layers and the said barrier layer adjacent thereto in the ferromagnetic double quantum well tunneling magnetoresistance device according to the present invention has between them a hetero interface that is atomically flat and abrupt.

Also, the said barrier layers in the ferromagnetic double quantum well tunneling magnetoresistance device according to the present invention are formed each to have a thickness that enables the carrier to tunnel therethrough.

Further, the said first quantum well layer in the ferromagnetic double quantum well tunneling magnetoresistance device according to the present invention is made of either a ferromagnetic metal or a semiconductor exhibiting a ferromagnetism.

Also, the said second quantum well layer in the ferromagnetic double quantum well tunneling magnetoresistance device according to the present invention is made of either a ferromagnetic metal or a semiconductor exhibiting a ferromagnetism.

Further, the said barrier layer in the ferromagnetic double quantum well tunneling magnetoresistance device according to the present invention is made of either a nonmagnetic semiconductor or nonmagnetic insulator.

Also, the said first and second quantum well layers in the ferromagnetic double quantum well tunneling magnetoresistance device according to the present invention has a quantum level of a given energy that, and the carriers have a given tunneling probability that, are set up by regulating the thickness of each of the said first and second quantum well layers and the individual thickness and barrier height of the said barrier layers.

Further, the device according to the present invention is operable with a bias voltage that is set up at a desired magnitude by changing the thickness of each of the said first and second quantum well layers.

In a ferromagnetic double quantum well tunneling magnetoresistance device of such a construction as described above, the carriers confined in each quantum well form quantum levels and make up a two-dimensional electron (positive hole) system. Because the quantum well is ferromagnetic, the quantum levels are spin-split into a spin level that points upwards and a spin level that points downwards.

Also, in a ferromagnetic double quantum well tunneling magnetoresistance device of such a construction as described above, if the two (first and second) quantum well layers of ferromagnetic material are substantially equal in thickness, when they are magnetized parallel to each other in their pointing direction of magnetizations, their respective, two neighboring quantum levels that are equal in energy are equal in spin direction. Then, tunneling of the carriers between the two quantum wells easily takes place.

At Also, in a ferromagnetic double quantum well tunneling magnetoresistance device of such a construction as described above, when to the contrary the two quantum well layers are magnetized antiparallel to each other or opposite in their pointing directions of magnetizations, their respective, two neighboring quantum levels that are equal in energy are opposite to each other in spin direction. Then, tunneling of the carriers between the two quantum wells is inhibited.

Also, in a ferromagnetic double quantum well tunneling magnetoresistance device of such a construction as described above, a large difference in the tunneling probability between the two quantum wells between the state in which they are magnetized parallel as above and the state in which they are magnetized antiparallel as above, brings about a large change (difference) in electric resistance between the electrodes across them when electric current is being passed in the direction perpendicular to their interface.

Further, in a ferromagnetic double quantum well tunneling magnetoresistance device of such a construction as described above, having the two (first and second) quantum well layers of ferromagnetic material had a difference in coercive force permits readily changing their states of magnetization controllably by manners in which an external magnetic field is applied thereto. This in turn permits establishing two distinct states, i.e., one in which the magnetizations are parallel and the electric resistance is low and the other in which the magnetizations are antiparallel and the electric resistance is extremely high, ideally infinitely great.

Accordingly, a ferromagnetic double quantum well tunneling magnetoresistance device of the present invention that permits external magnetic fields to steadily establish one state in which the two quantum wells are magnetized parallel in their pointing direction and the other state in which they are magnetized antiparallel, makes it possible to achieve a magnetoresistance effect much greater than the conventional device without recourse to a double quantum well.

Finally, a ferromagnetic double quantum well tunneling magnetoresistance device of such a construction as described above, allows the amount of energy of a quantum level and the probability of tunneling of carriers to be set up by controlling on an atomic level the layer thickness of a quantum well and the thickness and barrier height of barrier layers. A suitable bias voltage as desired can thereby be set up.

In order to achieve the second object mentioned above, there is also provided in accordance with the present invention a sensitive magnetic sensor that is constructed to incorporate a ferromagnetic double quantum well tunneling magnetoresistance device of the present invention, the magnetic sensor utilizing the nature of the ferromagnetic double quantum well tunneling magnetoresistance device of the invention that a change in direction of magnetizations in a said first and a said second quantum layer is created according to an external magnetic field which the device is placed under, and changes a carriers' tunneling current between them, thereby producing a change in magnetoresistance across them.

A magnetic sensor so constructed as above according to the present invention, provided the ability to establish two distinct states in the first and second double quantum well layers, i.e., one state in which the magnetizations are parallel and the electric resistance is low and the other in which the magnetizations are antiparallel and the electric resistance is extremely high, ideally infinitely great, is capable sensing magnetism with an increased sensitivity and reliability.

In order to achieve the third object mentioned above, there is also provided in accordance with the present invention a three terminal ferromagnetic double quantum well tunneling magnetoresistance nonvolatile storage device, which is constructed to incorporate a ferromagnetic double quantum well tunneling magnetoresistance device of the present invention and further to include an electrode (third electrode) provided for each of a said first and a said second quantum well layer of the ferromagnetic double quantum well tunneling magnetoresistance device of the invention.

In a three terminal ferromagnetic double quantum well tunneling magnetoresistance nonvolatile storage device so constructed as above according to the present invention, the third electrodes can have voltages applied thereacross whose difference in voltage is capable of controllably establishing and de-establishing a resonant tunneling state between the first and second quantum well layers, thereby to selectively enable and disable reading a state of magnetizations of the first and second quantum well layers.

Also, in order to achieve the third object mentioned above, there is further provided in accordance with the present invention a readable and writable nonvolatile storage that comprises storage cells each of which comprises a said ferromagnetic double quantum well tunneling magnetoresistance device and a semiconductor switching device.

A readable and writable nonvolatile storage so constructed as above according to the present invention permits reading and writing at an increased speed.

Also, in order to achieve the third object mentioned above, there is further provided in accordance with the present invention a readable and writable nonvolatile storage that comprises storage cells each of which comprises a three terminal ferromagnetic double quantum well tunneling magnetoresistance nonvolatile storage device.

A readable and writable nonvolatile storage so constructed as above according to the present invention not only enables reading and writing at an increased speed, but, by eliminating the need to use a semiconductor switching device, permits storage cells to be integrated to a high degree.

BRIEF DESCRIPTION OF THE DRAWINGS

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to limit the present invention but to facilitate an explanation and understanding thereof.

In the drawings.

BEST MODES FOR CARRYING OUT THE INVENTION

Figure 1:
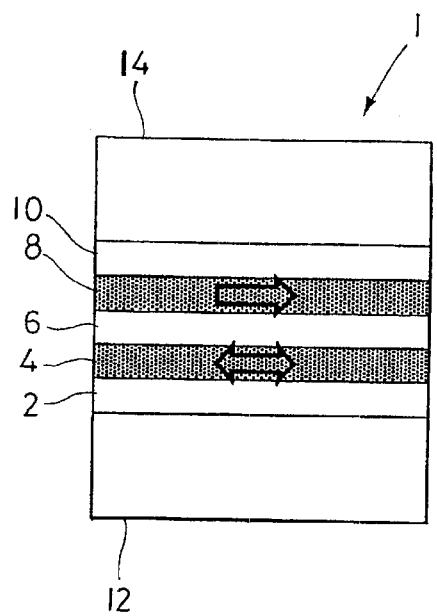
FIG. 1 is a diagrammatic illustration depicting a structure of a ferromagnetic double quantum well tunneling magnetoresistance device according to this invention.

Hereinafter, the present invention will be described in detail with reference to suitable, presently best forms of embodiment thereof illustrated in the drawing figures.

FIG. 1 is a diagrammatic illustration depicting a structure of a ferromagnetic double quantum well tunneling magnetoresistance device according to the present invention.

Referring to FIG. 1, a ferromagnetic double quantum well tunneling magnetoresistance device according to the present invention has a hetero or hetero-junction laminar structure made of a first barrier layer of nonmagnetic material 2, a first quantum well layer of ferromagnetic material 4, a second barrier layer of nonmagnetic material 6, a second quantum well layer of ferromagnetic material 8 and a third barrier layer of nonmagnetic material 10. The first and third barrier layers 2 and 10 are formed with electrode layers 12 and 14 of nonmagnetic material, respectively.

Further, the two quantum well layers of ferromagnetic material are formed so they have a difference in coercive force, such that when an external magnetic field is applied thereto, they are capable of establishing a first and a second state in which magnetizations caused in the first and second quantum well layers are oriented parallel and antiparallel to each other, respectively.

The coercive force of each quantum well layer of ferromagnetic material can be controllably varied by changing epitaxial growth conditions such as temperature, growth rate and chemical composition to change properties of the quantum well layer. It is thus possible to form the two quantum well layers in a low-temperature epitaxy process so they have a difference in coercive force.

The first and second quantum well layers 4 and 8 of ferromagnetic material are each a thin layer having a thickness in a range from several to ten and several nanometers, well shorter than the de Broglie wavelength of carriers therein, i.e., electrons or positive holes, which bear electric conduction. Further, the first and second quantum well layers 4 and 8 are so formed that with the carriers therein subjected to a quantum confinement they are each brought into a two-dimensional electron or a two-dimensional positive hole state.

The first, second and third barrier layers 2, 6 and 10 of nonmagnetic material are formed to be as thin as several nanometer, enough for the carriers to tunnel therethrough.

Further, the hetero interface between each quantum well layer and each adjacent barrier layer is formed to be atomically flat and abrupt. However, the electrode layers 12 and 14 of nonmagnetic material may have any thickness as desired and are formed of a material that is low in electrical resistance.

Figure 2:
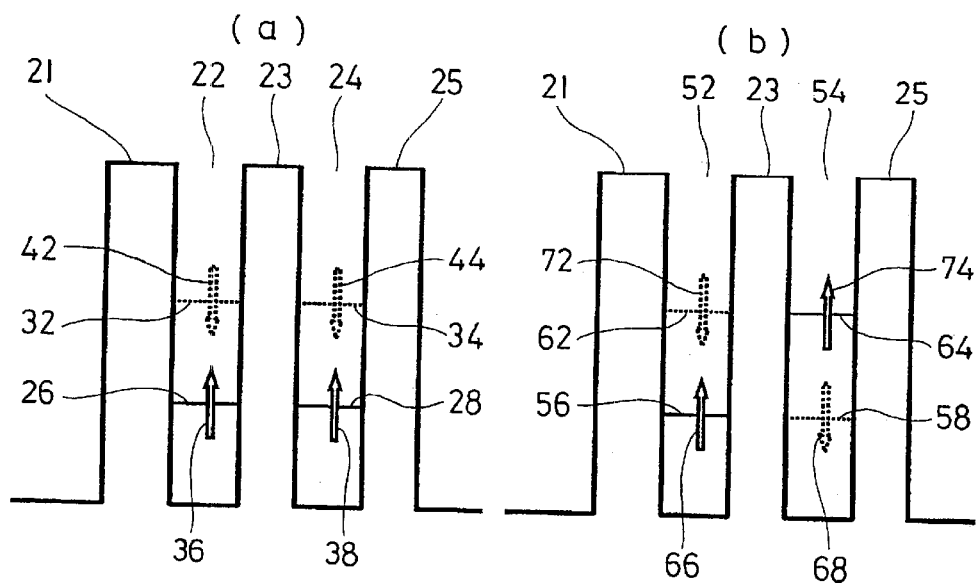
FIGS. 2A and 2B are energy band diagrams for a ferromagnetic double quantum well of a ferromagnetic double quantum well tunneling magnetoresistance device according to the present invention in which magnetizations caused in the two quantum wells are oriented parallel and antiparallel to each other, respectively.

FIGS. 2A and 2B are energy band diagrams for a ferromagnetic double quantum well of a ferromagnetic double quantum well tunneling magnetoresistance device according to the present invention in which magnetizations caused in the two quantum wells are oriented parallel and antiparallel to each other, respectively.

As shown in FIG. 2A, if magnetizations in two quantum wells 22 and 24 are oriented parallel to each other, two adjoining quantum levels 26 and 28 (or quantum levels 32 and 34) of an equal energy have their respective spins 36 and 38 (or spins 42 and 44) which are equally ori ented and pointing upwards (or downwards), thus enabling the carriers easily to tunnel between the two quantum wells.

On the other hand, if magnetizations in two quantum wells 52 and 54 are oriented antiparallel to each other, as shown in FIG. 2B, two adjoining quantum levels 56 and 58 (or quantum levels 62 and 64) even if their amounts of energy are equal to each other have their respective spins 66 and 68 (or spins 72 and 74) which are pointing opposite to each other, thus inhibiting the carriers from tunneling between the two quantum wells.

It should be noted further in FIGS. 2A and 2B that numerals 21, 23 and 25 represent the energy barriers corresponding to the first, second and third barrier layers.

A ferromagnetic double quantum well tunneling magnetoresistance device according to this invention is possible of realization, regardless of which of metal or semiconductor or what material family it is composed of, thus only if it has a ferromagnetic double quantum well structure. For example, a quantum hetero structure, namely a super lattice/quantum well structure in which a III-V compound semiconductor is a base may be formed having its hetero interfaces made abrupt and flat. More specifically, a ferromagnetic semiconductor, (GaMn)As, and a nonmagnetic semiconductor AlAs may be laminated. Thus, in this material system, the ferromagnetic quantum well layers are formed of (GaMn)As and the nonmagnetic barrier layers are formed of AlAs.

Further, a hetero structure made of a ferromagnetic metal and a semiconductor may form the ferromagnetic double quantum well structure. An example is a hetero structure formed of ferromagnetic metal MnAs and semiconductor GaAs. In this material system, the ferromagnetic quantum well layers are made of MnAs and the nonmagnetic barrier layers are made of GaAs. By the way, not only may the barrier layers be made of a nonmagnetic semiconductor, but also they may be made of a nonmagnetic insulator.

The hetero structure of barrier layers and quantum well layers of the present invention may be formed by a low-temperature molecular beam epitaxial growth process.

For example, a monoatomic layer of different elements may be formed on a semiconductor surface, on which layer a substance sought to epitaxially grow can be caused to build up. Alternatively, a semiconductor surface may be structurally modified by changing growth conditions such as temperature to assume a state that it possesses a particular atomic arrangement configuration, whereupon a substance sought to epitaxially grow is caused to grow. This permits combining quite dissimilar substances such as a semiconductor and a magnetic metal together and enables a single-crystal hetero structure of good quality to grow from them.

An explanation is next given in detail in respect of an operation of this invention.

A ferromagnetic double quantum well tunneling magnetoresistance device according to the present invention utilizes a tunnel phenomenon that is caused to take place between two-dimensional electron and positive hole systems (hereinafter referred generally to as "two-dimensional electron systems" and mentioned as regards electrons) in ferromagnetic quantum wells. In the absence of scattering in the tunnel process, an electron energy, spin s, and momentum k in a direction parallel to an interface satisfy the conservation law.

Consequently, if magnetizations of two quantum wells are antiparallel as shown in FIG. 2B, adjoining quantum levels if of equal energy have their spins which are pointing contrary to each other, thus completely inhibiting the carriers from tunneling between the two quantum wells; hence the resistance between them becomes infinitely great.

This is based on the fact that even if the carriers were tunneling to the state which the spin point equally towards, no such the state exists in the neighboring quantum well that both their energy and momentum parallel to the interface may be conserved. This situation does not change if the ferromagnetic layers are lower in spin polarization.

On the other hand, if magnetizations in the two quantum wells are parallel to each other and pointing equally towards as shown in FIG. 2A, the tunnel process is allowed to occur, permitting a tunnel current to flow with the electric resistance having a finite value.

Accordingly, the present structure that utilizes a tunneling phenomenon between two dimensional electron systems in a double ferromagnetic quantum well enables deriving an extremely large, ideally infinitely great tunneling magnetoresistance ratio, regardless of magnitudes of spin polarization and compositions of ferromagnetic material.

Further, controlling, on an atomic level, the thickness of a quantum well layer and the thickness and height of a barrier layer in a quantum well of the present invention allows controlling the energy of a quantum level and the tunneling probability of carriers.

The barrier height is determined by a combination of substances that make up the barrier layers and the quantum well layers. For example, if the barrier layers are formed of a compound semiconductor, ternary alloy $(Al_xGa_{1-x})As$, changing the composition x from 0 to 1 is found to allow changing the height of barrier for electrons by about 1 eV and the height of barrier for positive holes by around 0.5 eV. Consequently, it is seen that the electric current can controllably be adjusted by changing the thickness and the height of barrier of the barrier layers.

Further, changing the layer thickness of one or both of the two quantum wells is found to allow changing the magnitude of a voltage to be applied to cause a resonant tunneling phenomenon that permits an increased current to flow. The bias voltage can thereby be controllably adjusted.

Thus, a device of this structure permits deriving a large tunneling magnetoresistance ratio with a desired bias voltage.

An explanation is next given in respect of applications of a ferromagnetic double quantum well tunneling magnetoresistance device according to the present invention.

Utilizing the principle that an extremely large, ideally infinitely great tunneling magnetoresistance ratio is obtained according to this invention, regardless of magnitudes of spin polarization and compositions of ferromagnetic material, a variety of device applications are possible from the basic structure shown in FIG. 1.

To begin with, this invention can be applied to obtain a highly sensitive magnetic sensor. The fact that resistance varies to a large extent under magnetic fields in a ferromagnetic double quantum well tunneling magnetoresistance device according to the present invention can be utilized to make a magnetic sensor with an increased sensitivity.

Further, using micro-machining technique allows the sensor to be formed so it can detect a magnetization or a magnetic filed in a very small area, or to be used to read out a magnetic recording medium. It can also be used as a safety measure or for control in a transport apparatus such as an automobile.

This invention can also be applied to obtain a nonvolatile storage. Using two ferromagnetic layers produces a hysteresis in the [magnetic field]-[electrical resistance] curve. To wit, the nature that the two states in which the two ferromagnetic layers are magnetized parallel (low resistance) and antiparallel (high resistance) are both stable makes the device bistable and suitable for use as a nonvolatile storage or memory. In this case, read is readily effected from a change in electrical resistance, whereas write requires a word line that passes a pulsed current to be disposed in the vicinity of the device to produce a magnetic field.

Thus, the micro-processed structure of FIG. 1 built up on a semiconductor substrate permits making a high-density nonvolatile storage that is monolithically integrated with a semiconductor LSI.

An explanation is given below in respect of a nonvolatile storage device that represents an application of the present invention.

A nonvolatile storage of this class comprises a plurality of nonvolatile storage or memory cells, and a word and a bit line for selecting a particular nonvolatile storage cell from the nonvolatile storage cells to write and read. Further such word lines and bit lines are arranged and distributed horizontally parallel and vertically parallel and a give storage cell is disposed at the intersection of a given word line and a given bit line. Each nonvolatile storage cell is constructed of a nonvolatile storage device and a switching device for selecting the storage cell.

Figure 3:
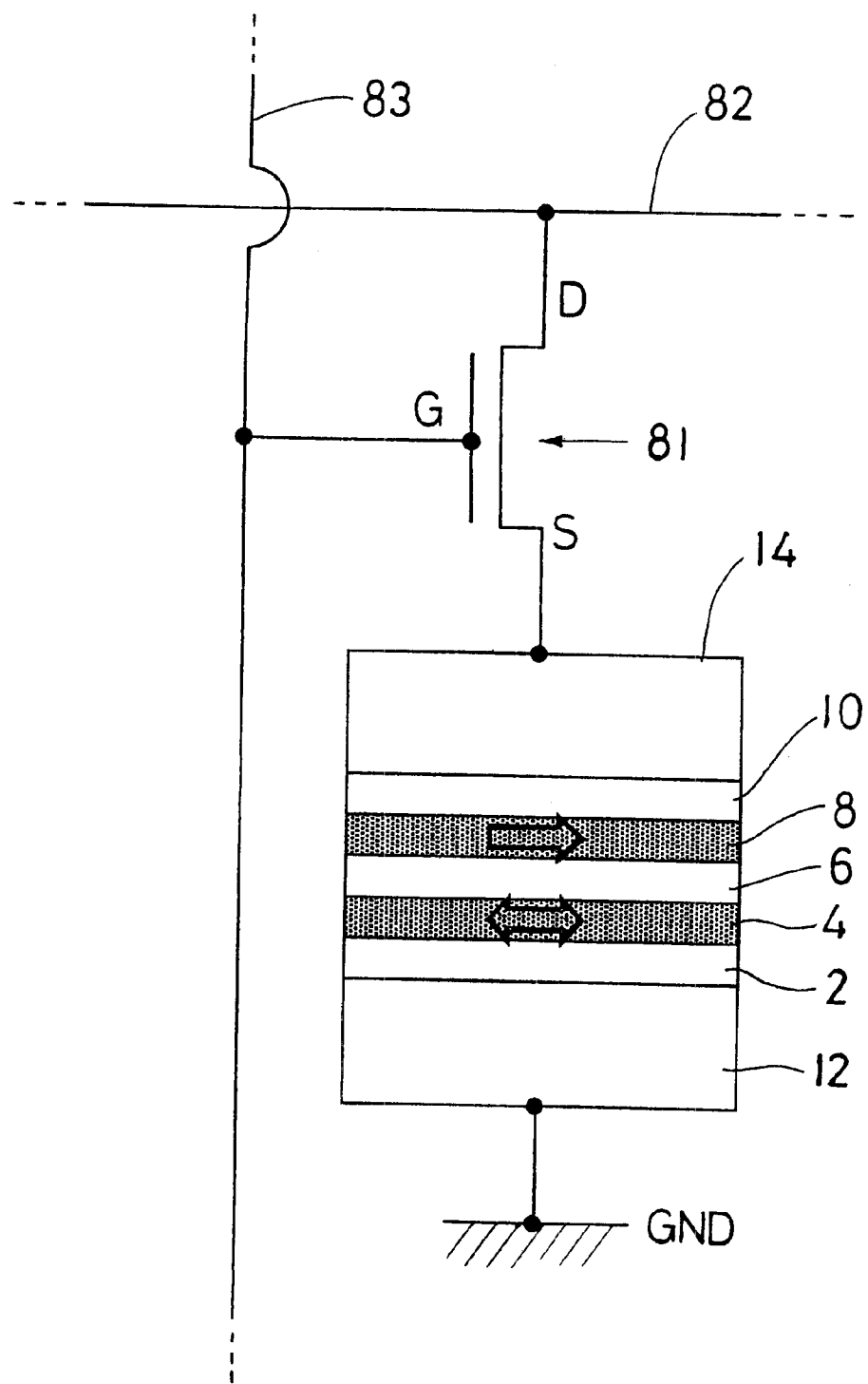
FIG. 3 is a circuit diagram that illustrates an electrical constitution of a ferromagnetic double quantum well tunneling magnetoresistance nonvolatile storage cell according to this invention, which is made of a ferromagnetic double quantum well tunnel magnetoresistance device of this invention and a semiconductor switching device.

FIG. 3 is a circuit diagram that illustrates an electrical constitution of a ferromagnetic double quantum well tunneling magnetoresistance nonvolatile storage cell according to this invention, which is made of a ferromagnetic double quantum well tunneling magnetoresistance device of this invention for the above nonvolatile storage device and a semiconductor switching device for the above switching device. An explanation is given of a nonvolatile storage cell with reference to FIG. 3.

In FIG. 3, shown at 1 is a ferromagnetic double quantum well tunneling magnetoresistance device of the present invention as shown in FIG. 1. Numeral 81 denotes a MOS transistor used as an example of the semiconductor switching device. Shown at 82 and 83 are a bit and a word line, respectively. The MOS transistor 81 has a drain terminal D connected to the bit line 82, a gate terminal G connected to the word line 83 and a source terminal S connected to one electrode layer 14 of the ferromagnetic double quantum well tunneling magnetoresistance device 1 of the present invention. The ferromagnetic double quantum well tunneling magnetoresistance device 1 of the present invention has a hetero structure in which a first barrier layer 2 of nonmagnetic material, a first quantum well layer 4 of ferromagnetic material, a second barrier layer 6 of nonmagnetic material, a second quantum well layer 8 of ferromagnetic material and a third barrier layer 10 of nonmagnetic material are successively laminated. The first and third barrier layers 2 and 10 are formed on their outer sides with electrode layers 12 and 14 of nonmagnetic material, respectively. The electrode layer 12 is connected to a ground GND.

An explanation is next given in respect of an operation of the nonvolatile storage cell mentioned above.

To read stored information, a voltage is applied to the selected word line 83 to turn on the MOS transistor 81 connected to the word line 83, and a read-out voltage is applied to the selected bit line 82 to pass an electric current between the bit line 82 and the ground GND. Then, from the resistance the states of magnetization in the first and second quantum well layers 4 and 8 are read out. To wit, the resistance of the double quantum well will be low (corresponding to the stored information ON or OFF) and will be high (corresponding to the stored information OFF or ON), respectively, when the first and second quantum well layers 4 and 8 are magnetized parallel and antiparallel to each other. In this manner, it can be read out if the information stored in the selected storage cell is ON or OFF.

To write, pulsed currents are passed through particular word and bit lines 83 and 82 selected. Magnetic fields resulting from these currents and superimposed upon each other are used to change the state of magnetization of the first or second quantum well layer 4 or 8. To wit, either the state in which the two ferromagnetic layers are magnetized parallel or the state in which they are magnetized antiparallel is written depending on the directions of the currents. In this way, an ON or OFF store information can be written. A high-speed and sensitive nonvolatile storage cell is thereby made possible of realization.

An explanation is next given in respect of a three terminal ferromagnetic double quantum well tunneling magnetoresistance nonvolatile storage device of the present invention, which makes possible a highly integrated nonvolatile storage cell.

A three terminal ferromagnetic double quantum well tunneling magnetoresistance nonvolatile storage device according to the present invention has a construction in which the two quantum well layers in the ferromagnetic double quantum well tunneling magnetoresistance device shown in FIG. 1 are formed with electrodes, respectively, and the difference in voltage (electric potential) between the two quantum wells is made independently controllable.

Figure 4:
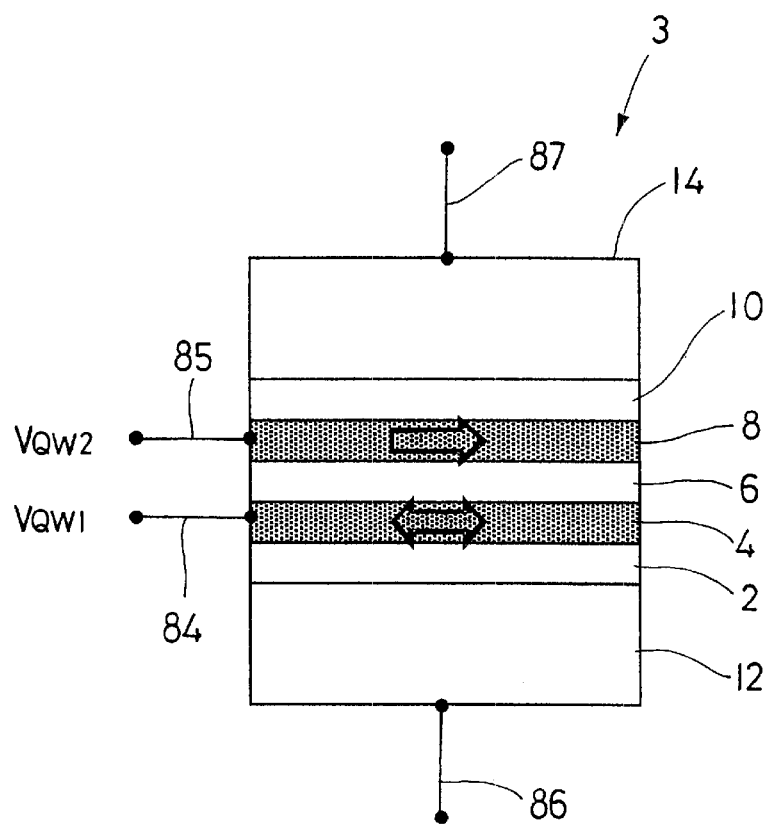
FIG. 4 is a constitutional view that illustrates a three terminal ferromagnetic double quantum well tunneling magnetoresistance device of this invention.

FIG. 4 shows the construction of such a three terminal ferromagnetic double quantum well tunneling magnetoresistance nonvolatile storage device according to the present invention.

Referring to FIG. 4, the three terminal ferromagnetic double quantum well tunneling magnetoresistance nonvolatile storage device of the present invention, as referred to by numeral 3, has a hetero structure in which a first barrier layer 2 of nonmagnetic material, a first quantum well layer 4 of ferromagnetic material, a second barrier layer 6 of nonmagnetic material, a second quantum well layer 8 of ferromagnetic material and a third barrier layer 10 of nonmagnetic material are successively laminated. The first and third barrier layers 2 and 10 are formed on their outer sides with electrode layers 12 and 14 of nonmagnetic material, respectively. Further, the first and second quantum well layers 4 and 8 of ferromagnetic material of this device are formed with electrodes, respectively, and are provided with control all terminals 84 and 85, respectively, which are capable of controlling their respective electric potentials. Here, the electrode layer 12 is referred to as "emitter" and what is indicated by numeral 86 is defined as "first terminal of the device provided at the emitter 12". Also, the electrode layer 14 is referred to as "collector" and what is indicated by reference numeral 87 is defined as "second terminal of the device provided at the collector 14". The control terminals 84 and 85 provided at the first and second quantum well layers 4 and 8 are each referred to as "third terminal" of the device. Characters $V_{QW1}$ and $V_{QW2}$ represent the voltages at the first and second quantum well layers 4 and 8, respectively.

An explanation is next given in respect of an operation of this device.

If the first and second quantum well layers 4 and 8 are constructed to be equal in thickness, they may have quantum levels that are equal in energy. Thus, setting through the control terminals 84 and 85 the voltages $V_{QW1}$ and $V_{QW2}$ at the first and second quantum well layers 4 and 8 to be made equal to each other to make their quantum levels with an equal energy coincident with each other creates a condition in the device that a resonant tunneling current can flow between these two quantum well layers. Accordingly, applying a voltage across the emitter 12 and the collector 14 to pass an electron current from the emitter 12 to the collector 14 permits reading a state of magnetization in the first and second quantum well layers 4 and 8 from a resistance that is found between the emitter 12 and the collector 14. To wit, the electric resistance will be low and high, if the two quantum well layers are magnetized parallel and antiparallel to each other, respectively.

On the other hand, if the voltages $V_{QW1}$ and $V_{QW2}$ at the first and second quantum well layers 4 and 8 are set through the control terminals 84 and 85 to have a large enough voltage difference, the device will be placed in the state that no resonant tunneling current can flow between the two quantum well layers. In this case, therefore, the inability for an electron current to flow from the emitter 12 to the collector 14 disables reading a state of magnetization in the first and second quantum well layers 4 and 8, regardless of what state it is.

In contrast to the example mentioned above in which the first and second quantum well layers 4 and 8 are equal in thickness, if they are different in thickness, the first and second quantum well layers 4 and 8 will have their quantum levels varied in energy. Then, setting through the control terminals 84 and 85 the voltages $V_{QW1}$ and $V_{QW2}$ at the first and second quantum well layers 4 and 8 to have a difference in voltage corresponding to a difference in energy of the two quantum levels creates the condition in the device under which a resonant tunneling current can flow as mentioned above. In this case, therefore, applying a voltage across the emitter 12 and the collector 14 to pass an electron current from the emitter 12 to the collector 14 permits reading a state of magnetization in the first and second quantum well layers 4 and 8 from an electric resistance that is found between the emitter 12 and the collector 14.

On the other hand, if the voltages $V_{QW1}$ and $V_{QW2}$ at the first and second quantum well layers 4 and 8 are set through the control terminals 84 and 85 to have a large enough voltage difference not corresponding to a difference in energy of the two quantum levels, the device will be placed in the state that no resonant tunneling current can flow between the two quantum well layers. In this case, therefore, the inability for an electron current to flow from the emitter 12 to the collector 14 disables reading a state of magnetizations in the first and second quantum well layers 4 and 8, regardless of what state it is.

As mentioned above, a three terminal ferromagnetic double quantum well tunneling magnetoresistance nonvolatile storage device is capable of enabling and disabling reading of a state of magnetizations in the first and second quantum well layers depending on a voltage difference applied to the third electrodes.

An explanation is next given in respect of a nonvolatile storage cell made of a three terminal ferromagnetic double quantum well tunneling magnetoresistance device according to the present invention.

Figure 5:
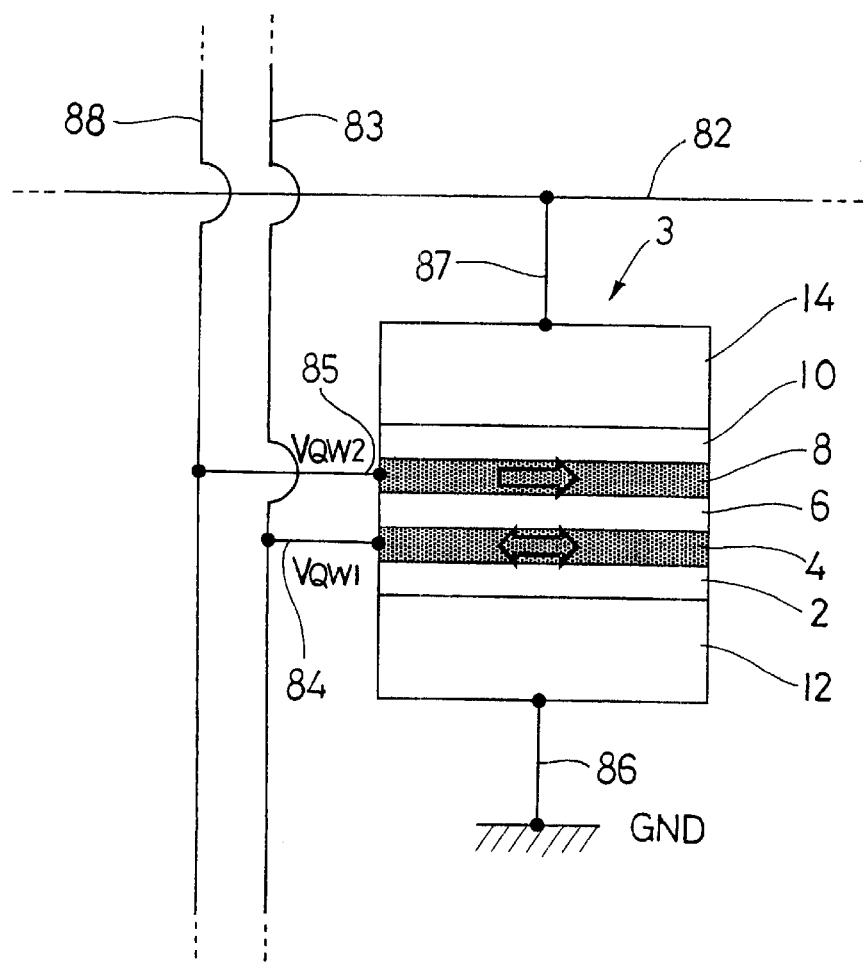
FIG. 5 is a circuit diagram that illustrates an electrical constitution of a nonvolatile storage cell made of a three terminal ferromagnetic double quantum well tunneling magnetoresistance device of the present invention.

FIG. 5 is a circuit diagram that illustrates an electrical constitution of a nonvolatile storage cell made of a three terminal ferromagnetic double quantum well tunneling magnetoresistance device of the present invention. Mention is made of the nonvolatile storage cell with reference to FIG. 5.

In FIG. 5, numeral 3 designates a three terminal ferromagnetic double quantum well tunneling magnetoresistance device of the present invention as shown in FIG. 4. The electrode layer 12 that is an emitter is connected via a connection terminal 86 to a ground GND. The first quantum well layer 4 is connected to a first word line 83 via a control terminal 84 that is a third terminal. The second quantum well layer 8 is connected to a second word line 88 via a control terminal 85 that is another third terminal. The electrode layer 14 that is a collector is connected to a bit line 82 via connection terminal 87.

An explanation is next given in respect of an operation of this nonvolatile storage cell.

Mention is made of a construction in which the first and second quantum well layers 4 and 8 are equal in thickness.

To read stored information, the voltages $V_{QW1}$ and $V_{QW2}$ at the first and second quantum well layers 4 and 8 are set through the selected word lines 83 and 88 SO as to establish the condition that a resonant tunneling current can flow across the two quantum wells. Then, a read-out voltage is applied to the selected bit line 82 to pass an electron current from the emitter 12 to the collector 14, and the electric resistance in between is detected. As has been noted before, the electric resistance of the double quantum well will be low (corresponding to the stored information ON or OFF) and will be high (corresponding to the stored information OFF or ON), respectively, when the first and second quantum well layers 4 and 8 are magnetized parallel and anti-parallel to each other. In this manner, it can be read out if the information stored in the selected storage cell ON or OFF.

On the other hand, if the voltages $V_{QW1}$ and $V_{QW2}$ at the first and second quantum well layers 4 and 8 are set through the selected word lines 83 and 88 to have a large enough voltage difference, the device will be placed in the state that no resonant tunneling current can flow between the two quantum well layers. In this case, even if a readout voltage is applied to the bit line 82, the inability for an electron current to flow from the emitter 12 to the collector 14 disables reading information stored in the nonvolatile storage cell, regardless of what state of magnetization the first and second quantum well layers 4 and 8 are placed in.

In this way, the third terminals are given the function of selectively enabling and disabling reading of information stored in a nonvolatile storage cell depending on whether the difference in voltage across the two third terminals is zero or a sufficient voltage difference. Therefore, with such third terminals, thus given the function of enabling a particular cell to be selected, selecting particular first and second word lines and a particular bit line followed by applying a read-out voltage to the particular bit line permits reading of information stored in a particular nonvolatile storage cell selected among a number of nonvolatile storage cells.

Further, to enable writing into a particular nonvolatile cell, though not illustrated in FIG. 5, a suitable arrangement of word and bit lines is adopted. Currents are passed through particular word and bit lines and magnetic fields resulting from these currents and superimposed upon one another are used.

Thus, writing of store information can be effected into a particular nonvolatile storage cell among a plurality of nonvolatile storage cells by selecting particular first and second word lines and a particular bit line and passing given currents through them.

Figure 6:
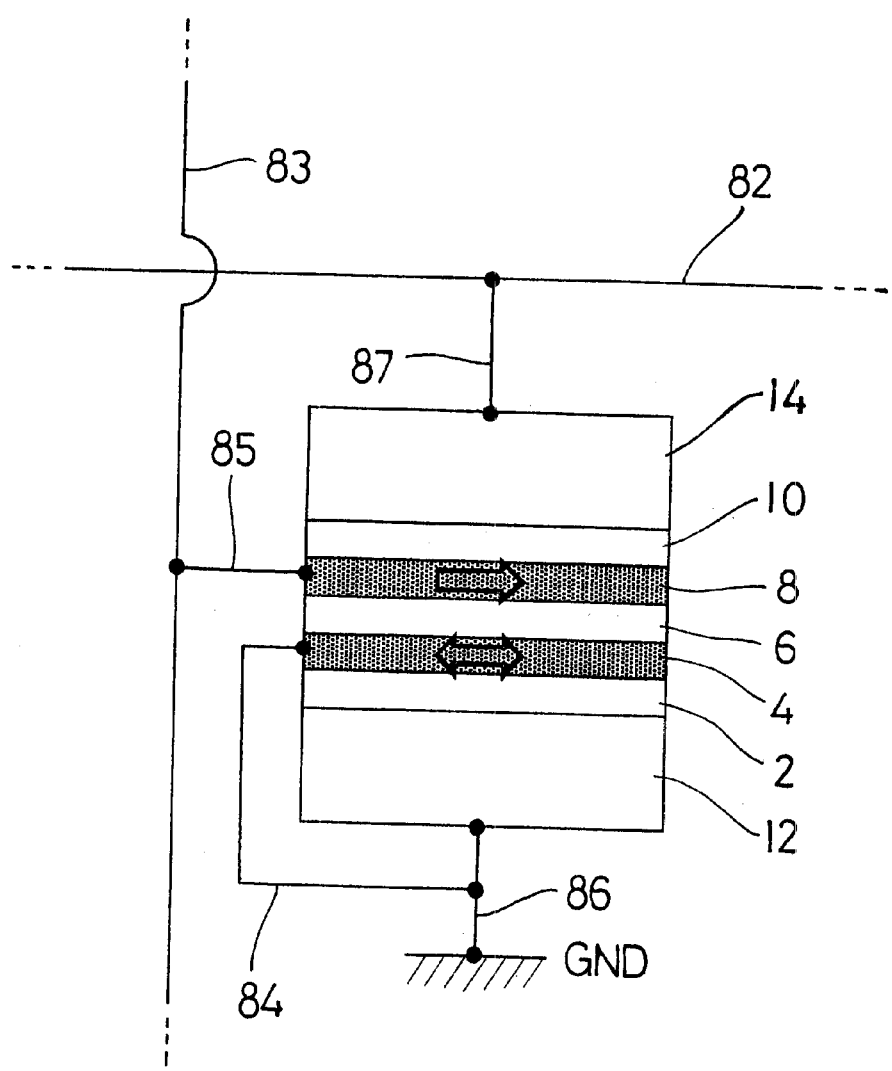
FIG. 6 is a circuit diagram that illustrates an electrical constitution of a nonvolatile storage cell made of a three terminal ferromagnetic double quantum well tunneling magnetoresistance device of the present invention in which a first quantum well layer has a terminal that is grounded.

While mention is made above of the set-up in which use is made for each cell of two word lines, namely a first and a second word line 83 and 88, it should be noted that since it is the difference in voltage between $V_{QW1}$ and $V_{QW2}$ that determines the resonant tunneling condition, one of the voltages at the first and second quantum well layers 4 and 8 may be fixed. FIG. 6 shows such a modification in which the control terminal 84 for the first quantum well layer is connected to the ground. In this case, each storage cell requires a single word line as shown in FIG. 6.

Also, while mention is made above of an example in which the first and second quantum well layers are equal in thickness, a difference in thickness changes the difference in voltages between $V_{QW1}$ and $V_{QW2}$ that causes the resonant tunneling required. Accordingly, the voltage to be applied to a word line for selecting a particular cell can be optionally altered by appropriately changing the relative thickness of the two layers.

As set forth in the above description, a three terminal ferromagnetic double quantum well tunneling magnetoresistance nonvolatile storage device of the present invention can alone build up a nonvolatile storage cell.

It thus eliminating the need to use a semiconductor switching device that occupies a large area, therefore increases the degree of integration of storages.

Also, without using a semiconductor device, a device according to the present invention does not suffer from the problem of a loss of yield due to variations in properties of the semiconductor device at the production.

Also, without using a semiconductor device, a device according to the present invention does not suffer from problems as regards matching between a ferromagnetic double quantum well manufacturing process and a semiconductor manufacturing process.

Although the present invention has been described hereinbefore in terms of certain illustrative forms of embodiments thereof, it will readily be appreciated by a person skilled in the art that many alterations thereof, omissions therefrom and/or additions thereto can be made without departing from the essence and the scope of the present invention. Accordingly, it should be understood that the invention is not intended to be limited to the specific forms of embodiment set forth above, but to include all possible forms of embodiment thereof that can be made within the scope with respect to the features specifically set forth in the appended claims and encompasses all the equivalents thereof.

INDUSTRIAL APPLICABILITY

In a ferromagnetic double quantum well tunneling magnetoresistance device according to this invention as will be apparent from the foregoing description, the thickness of a quantum well, and the thickness and height of a barrier layer are regulated on an atomic level to set the energy of a quantum level and the probability of tunneling, thereby establishing a bias voltage.

Thus, the present invention whereby two ferromagnetic quantum well layers made to have a difference in coercive force are placed into two states that they are magnetized parallel and antiparallel to each other under control by an external magnetic field to have a tunnel effect to develop controllably, provides an advantage of obtaining an infinitely great magneto resistance ratio with a given bias voltage as desired.

Further, a ferromagnetic double quantum well tunnel magnetoresistance device according to the present invention is effectively capable of utilization in a sensitive magnetic sensor or a nonvolatile storage owing to its extremely large magnetoresistance effect.

Further, providing a three terminal configuration in which a ferromagnetic double quantum well is provided with a third electrode or electrodes has the effect of permitting a resonant tunneling effect to controllably develop to selectively enable and disenable reading information stored in a storage.

Further, using this three terminal device in a storage cell has the effect of permitting a storage to be made highly integrated and in addition the effect of simplifying its manufacturing process and permitting such storages to be manufactured with good yield.

What is claimed is:

1. A ferromagnetic double quantum well tunneling magnetoresistance device including a sandwich structure comprising, in order:
   a first electrode;
   a first tunneling barrier layer;
   a first two-dimensional quantum well layer of ferromagnetic material;
   a second tunneling barrier layer;
   a second two-dimensional quantum well layer of ferromagnetic material;
   a third tunneling barrier layer; and
   a second electrode; wherein
   each of the first two-dimensional quantum well layer and the second two-dimensional quantum well layer is comparable to or thinner than a de Broglie wavelength of carriers in a three-dimensional electron system of the ferromagnetic material, whereby the carriers are quantum-confined;
   wherein a first interface between the first two-dimensional layer of ferromagnetic material and the second tunneling barrier layer is substantially atomically flat and abrupt;
   wherein a second interface between the second two-dimensional layer of ferromagnetic material and the second tunneling barrier layer is substantially atomically flat and abrupt; and
   wherein each of the first tunneling barrier layer, the second tunneling barrier layer, and the third tunneling barrier layer includes a respective barrier thickness that enables the carriers to tunnel therethrough;
   whereby a change in direction of magnetizations in the first two-dimensional quantum well layer and the second two-dimensional quantum well layer causes carriers to tunnel between them, thereby producing a change in magnetoresistance across them.

2. The ferromagnetic double quantum well tunneling magnetoresistance device as set forth in claim 1, wherein said first two-dimensional quantum well layer and said second two-dimensional quantum well layer are different in coercive force.

3. The ferromagnetic double quantum well tunneling magnetoresistance device as set forth in claim 1, comprising hetero interfaces that are substantially atomically flat and abrupt between the first two-dimensional layer of ferromagnetic material and the first tunneling barrier layer and between the second two-dimensional layer of ferromagnetic material and the third tunneling barrier layer.

4. The ferromagnetic double quantum well tunneling magnetoresistance device as set forth in claim 1, wherein said first two-dimensional quantum well layer comprises either a ferromagnetic metal or a semiconductor or a semiconductor exhibiting a ferromagnetism.

5. The ferromagnetic double quantum well tunneling magnetoresistance device as set forth in claim 1, wherein said second two-dimensional quantum well layer comprises either a ferromagnetic metal or a semiconductor or a semiconductor exhibiting a ferromagnetism.

6. The ferromagnetic double quantum well tunneling magnetoresistance device as set forth in claim 1 wherein said barrier layer comprises either a nonmagnetic semiconductor or nonmagnetic insulator.

7. The ferromagnetic double quantum well tunneling magnetoresistance device as set forth in claim 1, wherein said first two-dimensional quantum well layer and said second two-dimensional quantum well layer have a quantum level of a given energy and said carriers have a given tunneling probability that are set up by regulating a well-layer thickness of each of said first two-dimensional quantum well layer and said second two-dimensional quantum well layer and the barrier thickness and a barrier height of said first, second, and third tunneling barrier layers.

8. The ferromagnetic double quantum well tunneling magnetoresistance device as set forth in claim 1, wherein the device is operable with a bias voltage that is set at a desired magnitude by changing the thickness of each of said first two-dimensional quantum well layer and said second two-dimensional quantum well layer.

9. A sensitive magnetic sensor comprising
   a ferromagnetic double quantum well tunneling magnetoresistance device including a sandwich structure comprising, in order:
   a first electrode;
   a first tunneling barrier layer;
   a first two-dimensional quantum well layer of ferromagnetic material;
   a second tunneling barrier layer;
   a second two-dimensional quantum well layer of ferromagnetic material;
   a third tunneling barrier layer; and
   a second electrode; wherein
   each of the first two-dimensional quantum well layer and the second two-dimensional quantum well layer is comparable to or thinner than a de Broglie wavelength of carriers in a three-dimensional electron system of the ferromagnetic material, whereby the carriers are quantum-confined;
   wherein a first interface between the first two-dimensional layer of ferromagnetic material and the second tunneling barrier layer is substantially atomically flat and abrupt;
   wherein a second interface between the second two-dimensional layer of ferromagnetic material and the second tunneling barrier layer is substantially atomically flat and abrupt; and
   wherein each of the first tunneling barrier layer, the second tunneling barrier layer, and the third tunneling barrier layer includes a respective barrier thickness that enables the carriers to tunnel therethrough;

the sensor utilizing the nature of said ferromagnetic double quantum well tunneling magnetoresistance device such that a change in the resistance is produced according to an external magnetic field which the device is placed under.

10. A writable nonvolatile storage device comprising a ferromagnetic double quantum well tunneling magnetoresistance device including a sandwich structure comprising, in order:

a first electrode;

a first tunneling barrier layer;

a first two-dimensional quantum well layer of ferromagnetic material;

a second tunneling barrier layer;

a second two-dimensional quantum well layer of ferromagnetic material;

a third tunneling barrier layer; and a second electrode; wherein each of the first two-dimensional quantum well layer and the second two-dimensional quantum well layer is comparable to or thinner than a de Broglie wavelength of carriers in a three-dimensional electron system of the ferromagnetic material, whereby the carriers are quantum-confined;

wherein a first interface between the first two-dimensional layer of ferromagnetic material and the second tunneling barrier layer is substantially atomically flat and abrupt;

wherein a second interface between the second two-dimensional layer of ferromagnetic material and the second tunneling barrier layer is substantially atomically flat and abrupt; and wherein each of the first tunneling barrier layer, the second tunneling barrier layer, and the third tunneling barrier layer includes a respective barrier thickness that enables the carriers to tunnel therethrough;

the writable nonvolatile storage device utilizing the nature of the ferromagnetic double quantum well tunneling magnetoresistance device such that a first state of the device in which magnetizations in said first two-dimensional quantum well layer and in said second two-dimensional quantum well layer are parallel to each other and a second state thereof in which said magnetizations are antiparallel to each other are capable of discrimination by magnetoresistance across said first and second two-dimensional quantum well layers and said first state of the device and said second state of the device are both stable and capable of controlled establishment.

11. The nonvolatile storage device as set forth in claim 10, wherein said the first electrode and the second electrode have voltages applicable thereto whose difference in voltage across them is capable of controllably establishing and de-establishing a resonant tunneling state between said first two-dimensional quantum well layer and said second two-dimensional quantum well layer, thereby to selectively enable and disable reading a state of the magnetizations.

12. In combination, the nonvolatile storage device as set forth in claim 10 and a semiconductor switching device; wherein the nonvolatile storage device and the semiconductor switching device constitute a nonvolatile storage cell.

13. The nonvolatile storage device as set forth in claim 10, wherein said first electrode and said second electrode have voltages applicable thereto whose difference in voltage across them is capable of controllably establishing and de-establishing a resonant tunneling state between said first two-dimensional quantum well layer and said second two-dimensional quantum well layer, thereby to selectively enable and disable reading a state of the magnetizations;

wherein the nonvolatile storage device and the semiconductor switching device constitute a nonvolatile storage cell.

* * * * *